United States Patent [19]
Kim

[11] Patent Number: 6,137,739
[45] Date of Patent: Oct. 24, 2000

[54] MULTILEVEL SENSING CIRCUIT AND METHOD THEREOF

[75] Inventor: Kwan Weon Kim, Kyungki-Do, Rep. of Korea

[73] Assignee: Hyundai Electronics Industries Co., Ltd., Kyungki Do, Rep. of Korea

[21] Appl. No.: 09/342,176

[22] Filed: Jun. 29, 1999

[30] Foreign Application Priority Data

Jun. 29, 1998 [KR]  Rep. of Korea ........................ 98-24877
Jun. 30, 1998 [KR]  Rep. of Korea ........................ 98-25953

[51] Int. Cl.[7] .................................................... G11C 7/00
[52] U.S. Cl. ...................................... 365/205; 365/189.07
[58] Field of Search .............................. 365/205, 189.07, 365/196, 207, 190, 149

[56] References Cited

U.S. PATENT DOCUMENTS

| | | | |
|---|---|---|---|
| 4,300,210 | 11/1981 | Chakravarti et al. | 365/45 |
| 5,012,448 | 4/1991 | Matsuoka et al. | 365/208 |
| 5,283,761 | 2/1994 | Gillingham | 365/189.07 |
| 5,351,210 | 9/1994 | Saito | 365/189.01 |
| 5,452,244 | 9/1995 | Mohan Rao | 365/149 |
| 5,532,955 | 7/1996 | Gillingham | 365/149 |
| 5,594,691 | 1/1997 | Bashir | 365/189.09 |
| 5,612,912 | 3/1997 | Gillingham | 365/168 |
| 5,640,350 | 6/1997 | Iga | 365/186 |
| 5,684,736 | 11/1997 | Chan | 365/149 |
| 5,748,533 | 5/1998 | Dunlap et al. | 365/185.19 |
| 5,856,939 | 1/1999 | Seyyedy | 365/149 |
| 5,859,794 | 1/1999 | Chan | 365/149 |

FOREIGN PATENT DOCUMENTS

| | | |
|---|---|---|
| 63-276791 | 11/1988 | Japan . |
| 3-57270 | 3/1991 | Japan . |
| 7-37393 | 2/1995 | Japan . |
| 9-139071 | 5/1997 | Japan . |
| 10-188579 | 7/1998 | Japan . |
| 10-199269 | 7/1998 | Japan . |
| 10-320987 | 12/1998 | Japan . |
| 10-334672 | 12/1998 | Japan . |

*Primary Examiner*—David Nelms
*Assistant Examiner*—David Lam
*Attorney, Agent, or Firm*—Pennie & Edmonds LLP

[57] ABSTRACT

A multilevel sensing circuit and sensing method therefor. The multilevel sensing circuit has first and second sense amplifiers connected to each bit line to which left and right memory cells of a DRAM are connected, a feedback element connected to each bit line, and an isolating transistor including an NMOS transistor connected between the comparator and a sensing input node of the second sense amplifier. The isolating transistor is turned on after a second sensing operation is sufficiently carried out and turned off before a restore operation is carried out.

11 Claims, 20 Drawing Sheets

US 6,137,739

MULTILEVEL SENSING CIRCUIT AND METHOD THEREOF

BACKGROUND OF THE INVENTION

1. Field of the Invention

The present invention relates to a multilevel memory cell sense amplifier of a semiconductor device. Particularly, the present invention relates to a multilevel sensing circuit and a sensing method therefor, in which a secondary sensing input node is completely isolated, so that an effective deformation of the secondary sensing can be achieved, and its gain can be improved.

2. Description of the Prior Art

Generally, as the density of the DRAM is increased, its cells and the process become more fine. However, the chip size cannot be more reduced with the method of storing VCC or VSS into the cells, that is, with the presently exercised method.

However, if VCC, $\frac{2}{3}$ VCC, $\frac{1}{3}$ VCC and VCC can be stored and read, then the number of cells can be reduced to a half of that of the presently exercised method.

The multilevel sense amplifier will be specifically observed below referring to FIG. 1. As shown in this drawing, in the bit line and cells 2 and 4 of a DRAM, there are required: sense amplifiers 1 and 7 per bit line; a feedback element per bit line; a switching transistor 3 for dividing the bit line into two; and a comparator 5 consisting of an exclusive OR gate per bit line.

In the conventional sense amplifier, VCC ("1" data) or VSS ("0" data) is stored or read to and from a cell. However, in the multilevel sense amplifier, VCC ("1,1" data: strong one), $\frac{2}{3}$VCC ("1,0" data: weak one), $\frac{1}{3}$VCC ("0,1" data: weak zero), VSS ("0,0" data: strong zero) can be stored and read to and from a cell.

First, as shown in FIG. 2A, in the precharge period, an equalize signal EQU has a power source voltage VCC, and an NMOS transistors N7–N9 are all turned on. Therefore, bit lines BLL and BLR and bit line bars BLLB and BLRB are precharged with a half power source voltage (half VCC) (to be expressed "HVCC" below).

Under this condition, as shown in FIGS. 2C and 3D, VCT1 and VCT2 are all in a high voltage (VCC+=VPP), and therefore, sensing input nodes S3 and S4 of a second sense amplifier 7 is made to have a half power source voltage HVCC.

Here, an NMOS transistor N22 is precharged through an NMOS transistor N23, and therefore, the gate voltage of the NMOS transistor N23 has a half power source voltage HVCC, while the source has also a half power source voltage HVCC. Therefore, the node X4 of the comparator 5 has only a voltage HVCC-Vt, and thus, a problem occurs when carrying out the second data reading.

Second, in a read or write period, if a first word line WL1 is turned on to a high voltage VCC=VPP as shown in FIG. 2B, then an NMOS transistor N10 is turned on, with the result that the cell data is loaded on the bit lines BLL and BLR. Then the loaded data is transferred to the sensing input node S3 of the second sense amplifier 7. Then as shown in FIG. 2D, VCT2 is made to have a ground voltage VSS to turn off NMOS transistors N26 and N27. Thus the bit line BL and the sensing input node S3 of the second sense amplifier 7 are isolated from the bit line bar BLB and the sensing input node S4 of the second sense amplifier 7.

Then as shown in FIG. 2E, the first sense amplifier 1 which is connected through VSP1 and VSN1B to a sensing input node S1 and a sensing input node 52 is made active, thereby reading out a first data. As shown in FIG. 2F, a feedback voltage VFB is supplied with the power source voltage, and thus the coupling amount of capacitors C9 and C10 is adjusted through NMOS transistors V24 and N25 in accordance with the voltages of the right bit line BLR and the right bit line bar BLRB, i.e., the gate voltages of the NMOS transistors N24 and N15. Thus deformations are added to the sensing input node S3 and the sensing input node S4. Then VSP and VSN2B are operated as shown in FIG. 2G to activate the second sense amplifier 7, thereby reading out a second data.

Third, in a restore period, as shown in FIG. 2H, VMT0 is left in VCC+, while BMT1 is made to have a ground voltage VSS, thereby isolating the left bit line bar BLLB. Then the restore voltage VRST is supplied with VCC as shown in FIG. 2, and thus, in accordance with the potential of the node X4, if the node X4 is high, then the NMOS transistor N21 is turned on. Thus the node X1 is made to have VCC+, and through an NMOS transistor X2, there are shared the charge of left bit line BLL, the charge of the right bit line BLR, and the charge of the right bit line bar BLRB. Thus particular voltages ($\frac{2}{3}$VCC, $\frac{1}{3}$VCC) are formed to be restored to the left and right memory cells 2 and 4.

In the above, the read and write of the multisensing operation were described.

In the conventional multisensing operation, if the node X4 is not precharged with HVCC, but is precharged with HVCC-Vtn, then a problem occurs. Now descriptions will be made on this matter.

In the case where the cell data are 1,0, that is, in the case where $\frac{2}{3}$VCC is read out after its storing (the correct operation is carried out only if the data S1=VCC, S2=VSS, S3=VSS and S4=VCC are loaded), the equalize signal EQU is low so as to be disabled as shown in FIG. 4A. Therefore, a turning-off is done after precharging both the bit line BL and the bit line bar BLB.

Under this condition, the node X4 is considered to be precharged with HVCC, and the word line WL1 is turned on as shown in FIG. 4B, with the result that the data $\frac{2}{3}$VCC of the left and right memory cells 2 and 4 are loaded on the bit line BL, and are also loaded on the sensing input node S3 of the second sense amplifier 7.

The data, which is loaded on the sensing input node S3 and on the bit line BL, is "HVCC+ΔV", and VCT2 is low as shown in FIG. 4D. Therefore, the sensing input nodes S3 and S4 of the second sense amplifier 7 are isolated from the bit line BL and the bit line bar BLB, and then, the first sense amplifier 1 is activated by VSP1 and VSN1B as shown in FIG. 4E, thereby reading out a high data (S1=VCC and S2=VSS) as a first sensing.

Under this condition, As shown in FIG. 4L, a delta V10 justly shows a reduced sensing input margin compared with when VCC is stored in the left and right memory cells 2 and 4.

Under this condition, as shown in FIG. 4F, the feedback voltage VFB causes a variation in the second sensing input level. Under this condition, the VFB operating time greatly affects the variation of the sensing input node S4.

Here, the normal second sensing becomes possible only if a variation to S3="HVCC-Δ" is done owing to the feedback voltage VFB.

However, in this process, an actual problem occurs. That is, the right bit line BLR and the right bit line bar BLRB are spread from each other, with the result that the junction capacitors of the NMOS transistors N22 and N23 are coupled together. Consequently, an undesired deformation occurs in the sensing input nodes S3 and S4.

As shown in FIG. 4K, this deformation becomes severer, as the right bit line BLR and the right bit line bar BLRB are more spread from each other.

Therefore, when the right bit line BLR and the right bit line bar BLRB are not yet spread from each other, if the feedback voltage VFB is supplied, then the data deformation cannot be selectively carried out.

That is, the right bit line BLR should be high, with the result that the coupling of the capacitor C9 should occur very much through the NMOS transistor N24. Further, the right bit line bar BLRB should be low, with the result that the coupling of the capacitor C10 should occur to a small degree through the NMOS transistor N25. However, this phenomenon does not occur, and therefore, the sensing input nodes S3 and S4 cannot be deformed to the desired pattern (S3="HVCC$-\Delta$V", S4="GVCC$+\Delta$V).

For this reason, the optimization of the timing of the feedback voltage operation can be realized at a point where the undesired deformation due to the NMOS transistors N22 and N23 is small, and where selective operations of the NMOS transistors N24 and N25 are possible.

That is, it is at the point where the right bit line BLR is "HVCC+Vt", and the right bit line bar BLRB is "HVCC-Vt".

As shown in FIG. 8, in a simulation, it is at the point where if VCC=3.3 V, the right bit line BLR is 2.28 V, and the right bit liner bar BLRB is 0.89 V.

However, even if the operation of the feedback voltage VFB is optimized, normal operations for the respective data "1", "10", "01", "00" become difficult due to the undesired deformations by the node X4, which will be described below.

First, the node X4 will be described.

What potential (HVCC) the node X4 is precharged with gives a great influence to the second sensing input level.

That is, with the first sensing, if the right bit line BLR is spread to VCC, and if the right bit line bar BLRB is spread to VSS, then the right bit line BLR acts as the gate of the NMOS transistor N22 to turn on the NMOS transistor N22. Thus the node X4 and the node S4 are equalized, with the result that an undesired deformation occurs.

However, the node X4 can be actually precharged with only "HVCC-Vt", and therefore, a problem occurs.

That is, the first sensing causes that the right bit line BLR is spread to VCC, and the right bit line bar BLRB is spread to VSS until the right bit line BLR becomes "HVCC+Vt". Then the right bit line BLR acts as the gate voltage of the NMOS transistor N22 to turn on the NMOS transistor N22. Therefore, the node X4 and the sensing input node S4 begin to be equalized, with the ultimate result that the sensing input node S4 is greatly spread as shown in FIG. 13.

Under this greatly spread level, the sensing input node S4 should be laid upside down at a level higher than the node S3 through the NMOS transistor N24 owing to the feedback voltage VFB as shown in FIG. 4L. That is, S3="HVCC$-\Delta$V" and S4="HVCC$+\Delta$V" should be realized, but such an operation cannot occur, and therefore, the second sensing fails.

Even if the optimization in the operation of the feedback voltage VFB is realized, the problems of the node X4 is combined, with the result that the normal operations for the respective data "11", "10", "01" and "00" become difficult as shown in FIGS. 3 to 6.

Now the failures in the respective data will be described.

First, in the case where the data is "11", as shown in FIG. 7, the first data should be high (S3="HVCC$+\Delta$V" and S4="HVCC$-\Delta$V"), and the second data should also be high (S3="HVCC$+\Delta$V" and S4="HVCC$-\Delta$V").

Based on this pre-requisite, the situation will be considered. Upon carrying out the first sensing, the right bit line BLR and the right bit line bar BLRB begin to be spread toward VCC and VSS respectively, and the NMOS transistor N22 begins to be turned on. Further, the nodes X4 and S4 begin to be equalized, with the result that the potential of the sensing input node S4 is raised. Further, the potential of the node S4 is more raised due to the coupling between the capacitor C9 and the NMOS transistor N24 due to the feedback voltage VFB.

In the case of the data "11", the equalizing of the nodes X4 and S4 further aggravates the second sensing input margin.

Further, in the case of the data "11", due to the sustained coupling between the node S4 and the NMOS transistor N22, a data inversion occurs during the second sensing, thereby causing a failure.

Second, in the case of a data "10", as shown in FIG. 8, the first data should be high (S3="HVCC$+\Delta$V" and S4="HVCC$-\Delta$V"), and the second data should be low (S3="HVCC$-\Delta$V" and S4="HVCC$+\Delta$V").

To look into this matter, upon carrying out the first sensing, the right bit line BLR and the right bit line bar BLRB begin to be spread toward VCC and VSS respectively, and the NMOS transistor N22 is turned on. Further, the nodes X4 and S4 begin to be equalized, with the result that the potential of the sensing input node S4 is raised. Further, the potential of the node S4 is more raised due to the coupling between the capacitor C9 and the NMOS transistor N24 owing to the feedback voltage VFB.

In the case of the data "10", the equalizing of the nodes X4 and S4 improves the second sensing input margin.

Further, in the case of the data "10", due to the +sustained coupling between the node S4 and the NMOS transistor N22, the second sensing input margin is more improved, thereby excluding any problem.

Third, in the case where the data is "01", as shown in FIG. 9, the first data should be low (S3="HVCC$-\Delta$V" and S4="HVCC$+\Delta$V"), and the second data should be high (S3="HVCC$+\Delta$V" and S4="HVCC$-\Delta$V").

Based on this pre-requisite, the situation will be considered. Upon carrying out the first sensing, the right bit line BLR and the right bit line bar BLRB begin to be spread toward VCC and VSS respectively, and the NMOS transistor N23 begins to be turned on. Further, the nodes X4 and S4 begin to be equalized, with the result that the potential of the sensing input node S4 is raised. Further, the potential of the node S4 is more raised due to the coupling between the capacitor C10 and the NMOS transistor N25 owing to the feedback voltage VFB.

In the case of the data "01", the equalization of the nodes X4 and S4 improves the second sensing input margin.

Further, in the case of the data "01", due to the sustained coupling between the node S3 and the NMOS transistor N23, the second sensing input margin is more improved, thereby excluding any problem.

Fourth, in the case where the data is "00", as shown in FIG. 10, the first data should be low (s3="HVCC$-\Delta$V" and S4="HVCC$+\Delta$V"), and the second data should be also low (S3="HVCC$-\Delta$V" and S4="HVCC$+\Delta$V").

Based on this pre-requisite, the situation will be considered. Upon carrying out the first sensing, the right bit line BLR and the right bit line bar BLRB begin to be spread toward VCC and VSS respectively, and the NMOS transistor N23 begins to be turned on. Further, the nodes X4 and S4 begin to be equalized, with the result that the potential of the sensing input node S4 is raised. Further, the potential of the node S4 is more raised due to the coupling between the capacitor C10 and the NMOS transistor N25 owing to the feedback voltage VFB.

In the case of a data "00", the equalizing of the nodes X4 and S4 further aggravates the second sensing input margin.

Further, in the case of the data "00", due to the sustained coupling between the node S3 and the NMOS transistor N23, a data inversion occurs during the second sensing, thereby causing a problem.

In the above described operations for the respective data, the sustained couplings between the NMOS transistors N22 and N23 and the right bit line BLR, the right bit line bar BLRB and the sensing input nodes S3 and S4 give imbalances to the second sensing margin, thereby bringing failures.

Meanwhile, in the case of the restore, if the data is "10", then BLL=VCC, BLLB=VSS, BLR=VCC, BLRB=VSS, and node S4=VCC.

Under this condition, if VMT0=VCC+ and VMT1=VSS, and if the node X4 which has been in VCC is boosted to "VCC+ΔV", then the node X1 should be in VCC+. Further, the left bit line BLL, the right bit line BLR and the right bit line bar BLRB should be charge-shared, and thus, a ⅔*VCC potential has to be restored.

In fact, however, the right bit line bar BLRB which has been in VSS is charge-shared so as to rise up to ⅔*VCC.

In this process, the NMOS transistor N23 which has been turned off is shifted to a turned-on status.

In this manner, the node X4 which has been in "VCC"+ΔV is equalized to the sensing input node S3 which has been in VSS. Therefore, the sustained couplings between the NMOS transistors N22 and N23 and the right bit line BLR, the right bit line bar BLRB and the sensing input nodes S3 and S4 give imbalances to the second sensing margin, thereby bringing failures. Accordingly, there are produced the normal operations (the data "10" and "01") on the one hand, and failures (the data "11" and "00") on the other hand.

Further, when carrying out the restore, the node X4 becomes unstable.

That is, when carrying out the second sensing by the comparator 5 and the node X4, undesired interferences occur in the sensing input nodes S3 and S4.

SUMMARY OF THE INVENTION

The present invention is intended to overcome the above-described disadvantages of the conventional technique.

Therefore, it is an object of the present invention to provide a multilevel sensing circuit and a sensing method therefor, in which a secondary sensing input node is completely isolated, so that an effective deformation of the secondary sensing can be achieved and its gain can be improved.

It is another object of the present invention to provide a precharging circuit of a multilevel sense amplifier and a sensing method therefor, in which when carrying out a precharge in a multilevel sense amplifier circuit, a sufficient bit line voltage is supplied, so that the read data can be prevented from being deformed during a second sensing, thereby making it possible to carry our a perfect multisensing.

In achieving the above objects, the multilevel sensing circuit according to the present invention includes first and second sense amplifiers connected to each bit line to which left and right memory cells of a DRAM are connected, a feedback element connected to each bit line, a switching transistor for selecting a bit line, a comparator connected to each bit line, and an isolating transistor connected between the comparator and a sensing input node of the second sense amplifier, the isolating transistor configured to selectively connect the comparator to the sensing input node in response to a signal.

In one aspect of the invention, the isolating transistor is turned on after a second sensing operation is carried out and turned off before a restore operation is carried out.

In another aspect of the invention, the isolating transistor comprises an NMOS transistor controlled by using an equalize signal.

In yet another aspect, the invention is directed to a multilevel sensing method for storing and reading data to and from memory cells of a DRAM having a multilevel sensing circuit composed of first and second sense amplifiers connected to each bit line to which left and right memory cells of the DRAM are connected, a feedback element connected to each bit line, a switching transistor for selecting a bit line, and a comparator connected to each bit line, characterized in that a node of the comparator is precharged with a half power source voltage by an operation of an NMOS transistor.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENT

The operation principles of the present invention will be described in detail referring to the attached drawings.

Figure 12:
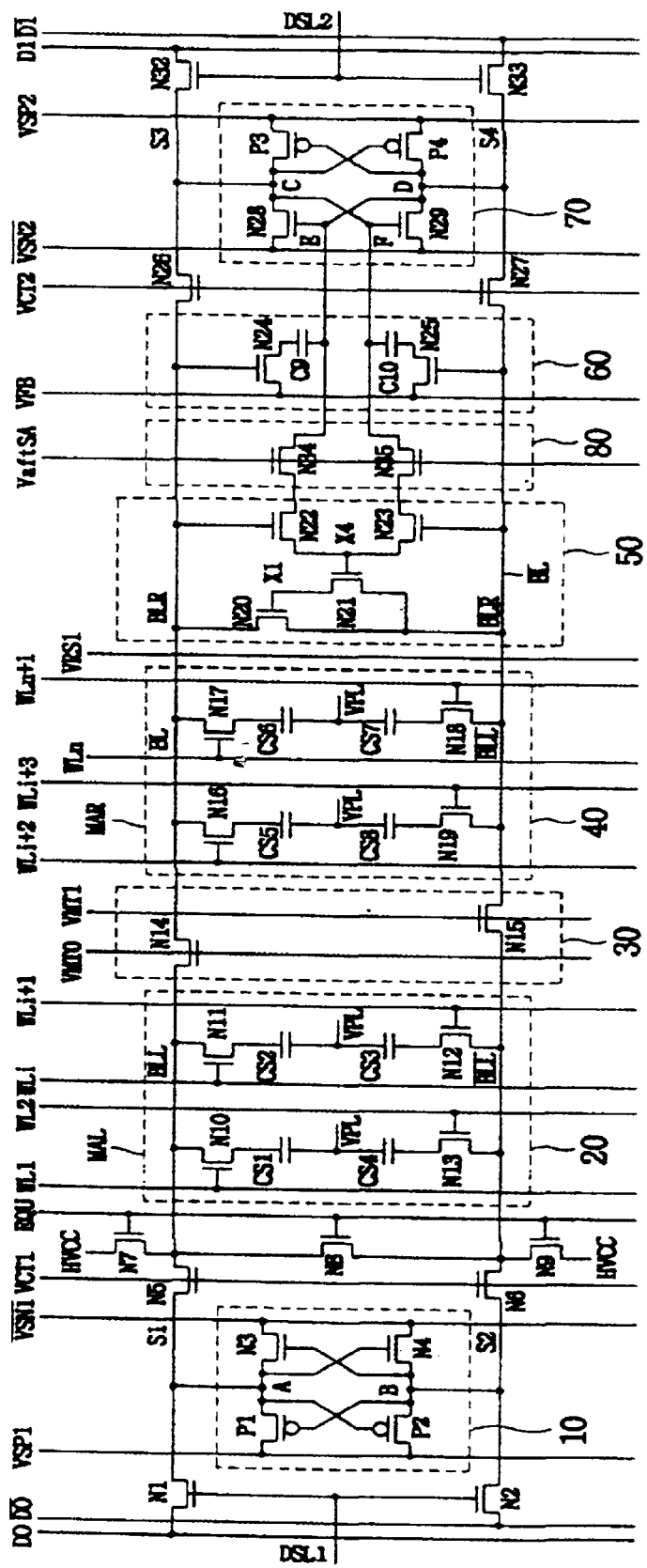
FIG. 12 is a circuit diagram showing the constitution of a first embodiment of the multilevel sensing circuit according to the present invention.

FIG. 12 is a circuit diagram showing the constitution of a first embodiment of the multilevel sensing circuit according to the present invention. Referring to FIG. 12, the multilevel sensing circuit according to the present invention includes: first and second sense amplifiers 10 and 70 per bit line of a general DRAM and per left and right memory cells 20 and 40; a feedback element 60 per bit line; a switching transistor 30 for branching a basic bit line; and a comparator 50 formed on the bit line, and the multilevel sensing circuit further includes an isolating transistor 80 consisting of NMOS transistors N34 and N35 and connected between sensing input nodes S3 and S4 of the second sense amplifier 70.

Of the isolating transistor 80, the source of the NMOS transistor N34 is connected to the sensing input node S4, its drain is connected to the comparator 50, and its gate is connected to a signal VaftSA which is enabled after a first sensing.

The NMOS transistor N35 has the same structure as that of the NMOS transistor N34. Its source is connected to the sensing input node S3, its drain is connected to the comparator 50, and its gate is connected to a signal VaftSA which is enabled after a first sensing.

Figure 13:
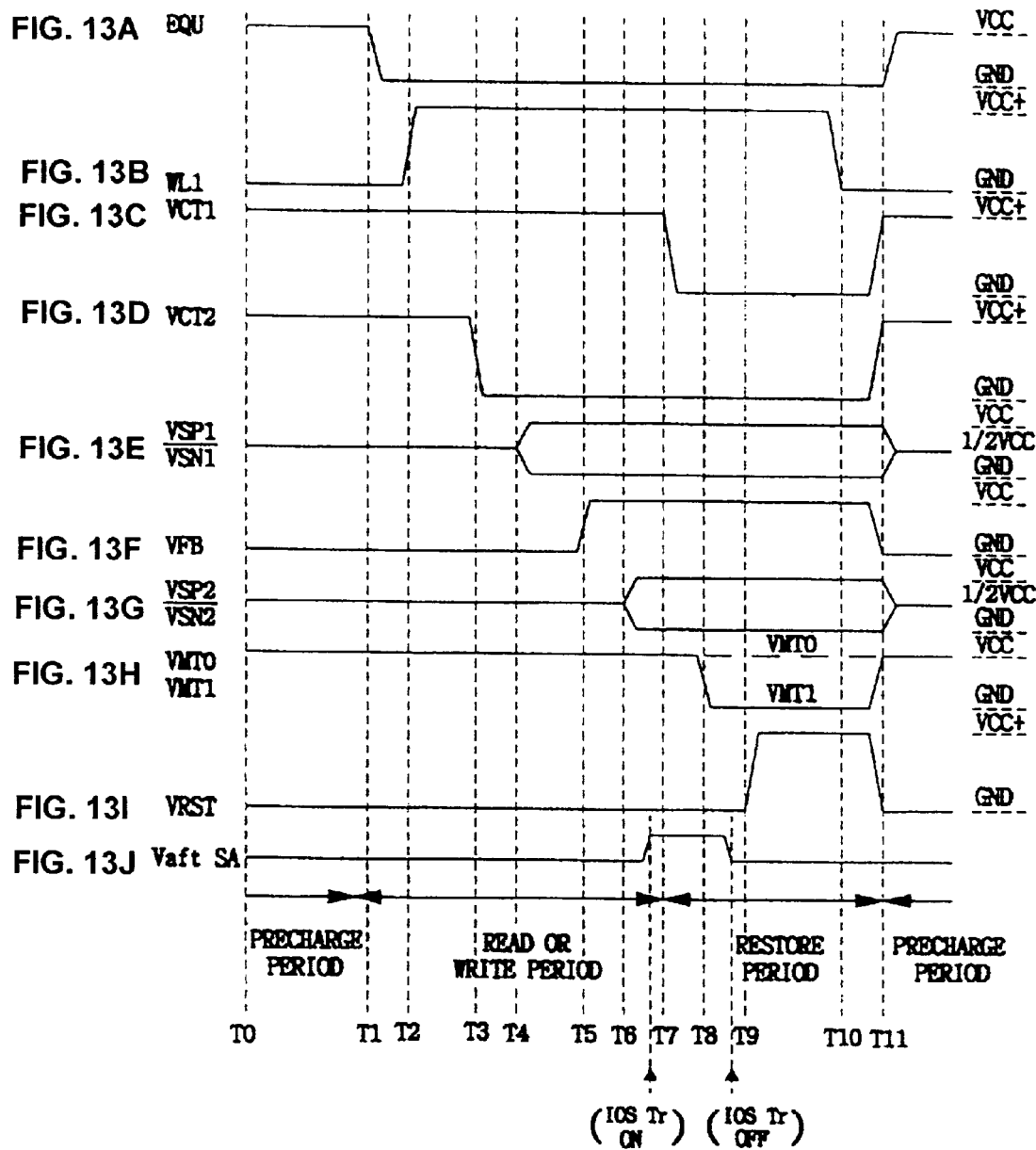
FIGS. 13A–13J is a timing chart for read and restore in the circuit of FIG. 12.

First, as shown in FIG. 13A, in the precharge period, an equalize signal EQU is in the power source voltage VCC, and NMOS transistors N7–N9 are all turned on. Therefore, bit lines BLL and BLR and bit line bars BLLB and BLRB are all precharged with a half power source voltage HVCC.

Under this condition, as shown in FIGS. 13C and 13D, VCT1 and VCT2 are all in a high voltage VCC+VPP, and therefore, the sensing input nodes S3 and S4 of the second sense amplifier 70 are put to a half power source voltage HVCC.

Second, in the read or write period, if a first word line WL1 is turned on with a high voltage VCC+VPP as shown in FIG. 13B, then an NMOS transistor N10 is turned on, with the result that the data charge share of the cell is loaded on the bit lines BLL and BLR. This loaded data is transferred to the sensing node S3 of the second sense amplifier 70, and NMOS transistors N26 and N27 are turned off, with VCT2 serving as the ground voltage VSS as shown in FIG. 13D. Thus the sensing input node S3 of the second sense amplifier 70 and the bit line BL and the sensing input node S4 of the second sense amplifier 70 and the bit line bar BLB are isolated from each other.

Then as shown in FIG. 13E, a sensing input node S1 and the first sense amplifier 10 connected to a sensing input node S2 are activated by VSP1 and VSN1B, so as to read a first data. Then as shown in FIG. 13F, a feedback voltage VFB is supplied as the power source voltage, and thus, the amount of coupling between capacitors C9 and C10 is adjusted in accordance with the gate voltages of NMOS transistors N24 and N25, that is, in accordance with the voltages of the right bit line BLR and the right bit line bar BLRB through the NMOS transistors N24 and N25.

In this manner, deformations are added to the sensing input nodes S3 and S4, and then, VSP2 and VSN2B are driven as shown in FIG. 13G so as to activate the second sense amplifier 70, thereby reading out a second data.

Figure 14:
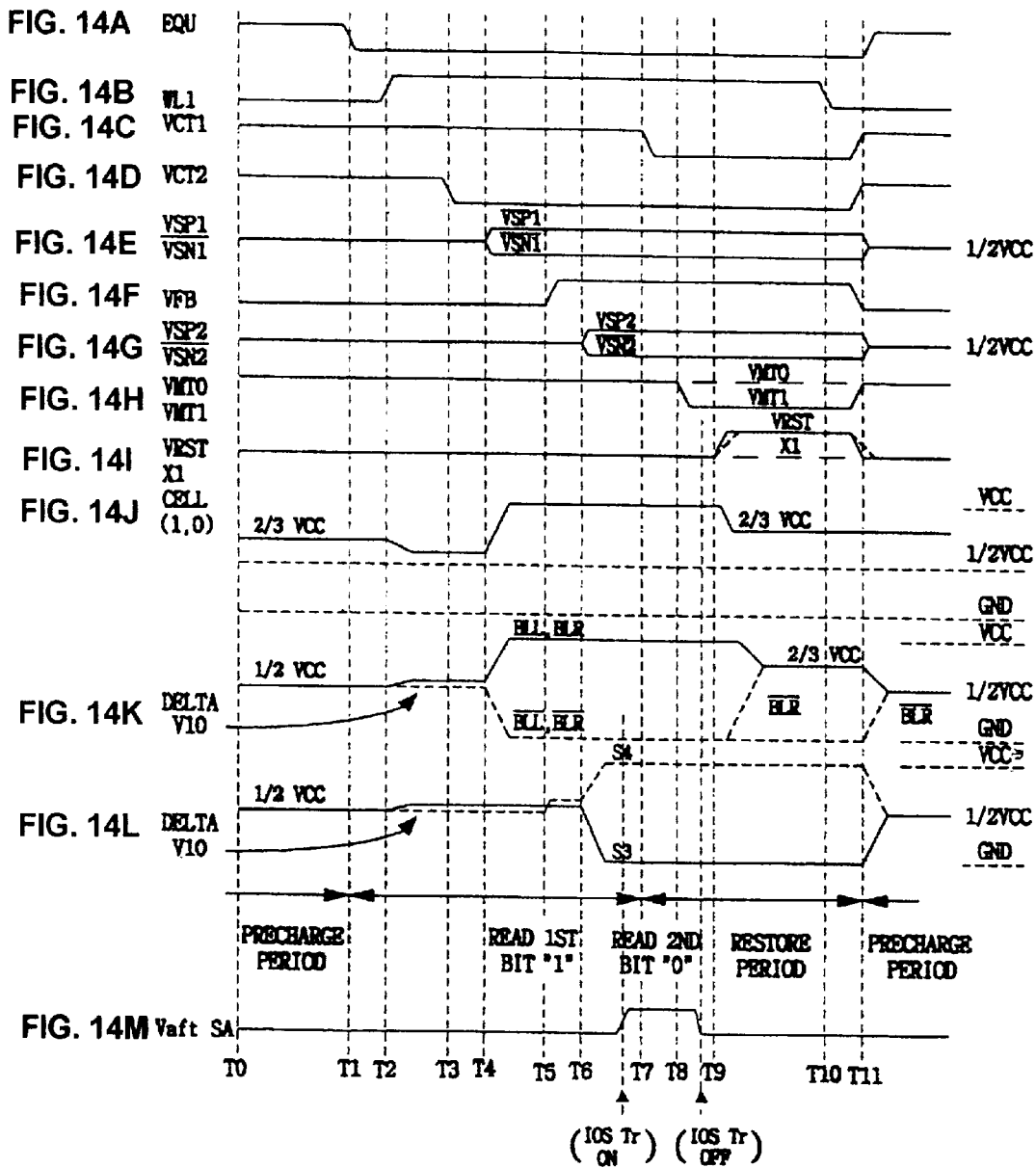
FIGS. 14A–14M is an internal timing chart for read and restore in the case where the data in FIG. 12 is a weak one (1,0)
Figure 15:
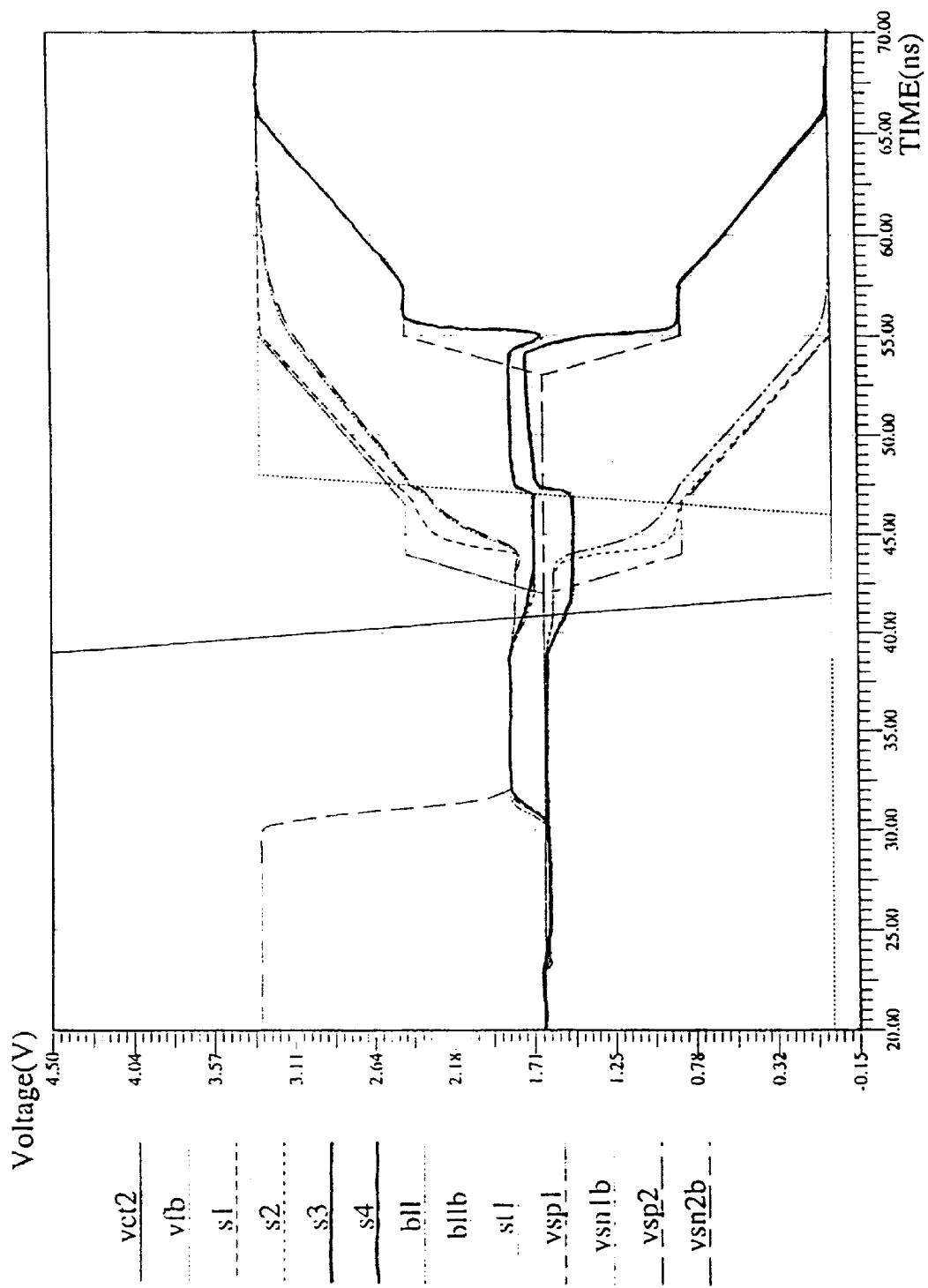
FIG. 15 illustrates the result of a second sensing simulation in the case where the data in FIG. 12 is a strong one (1,1)
Figure 16:
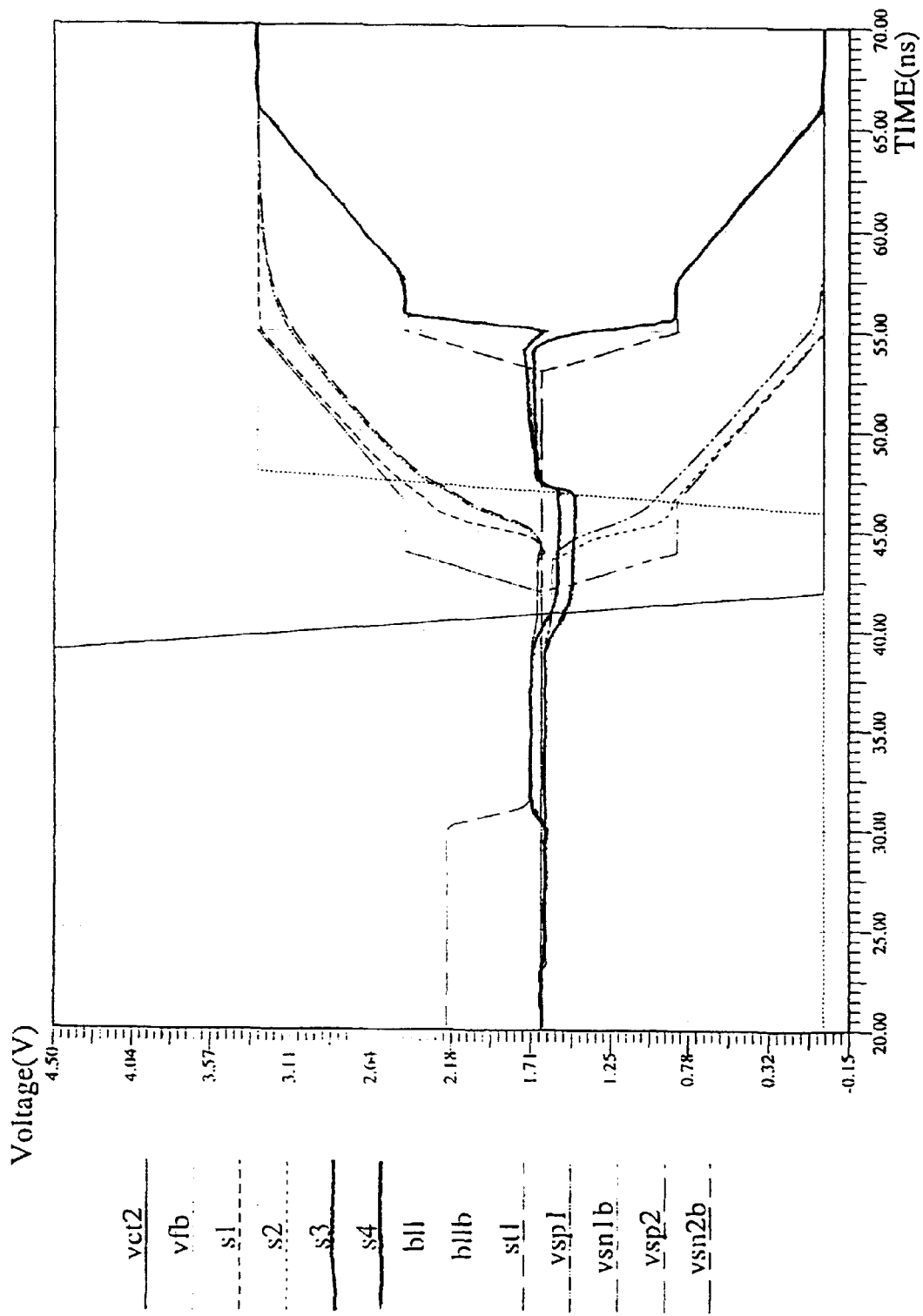
FIG. 16 illustrates the result of a second sensing simulation in the case where the data in FIG. 12 is a weak one (1,0)
Figure 17:
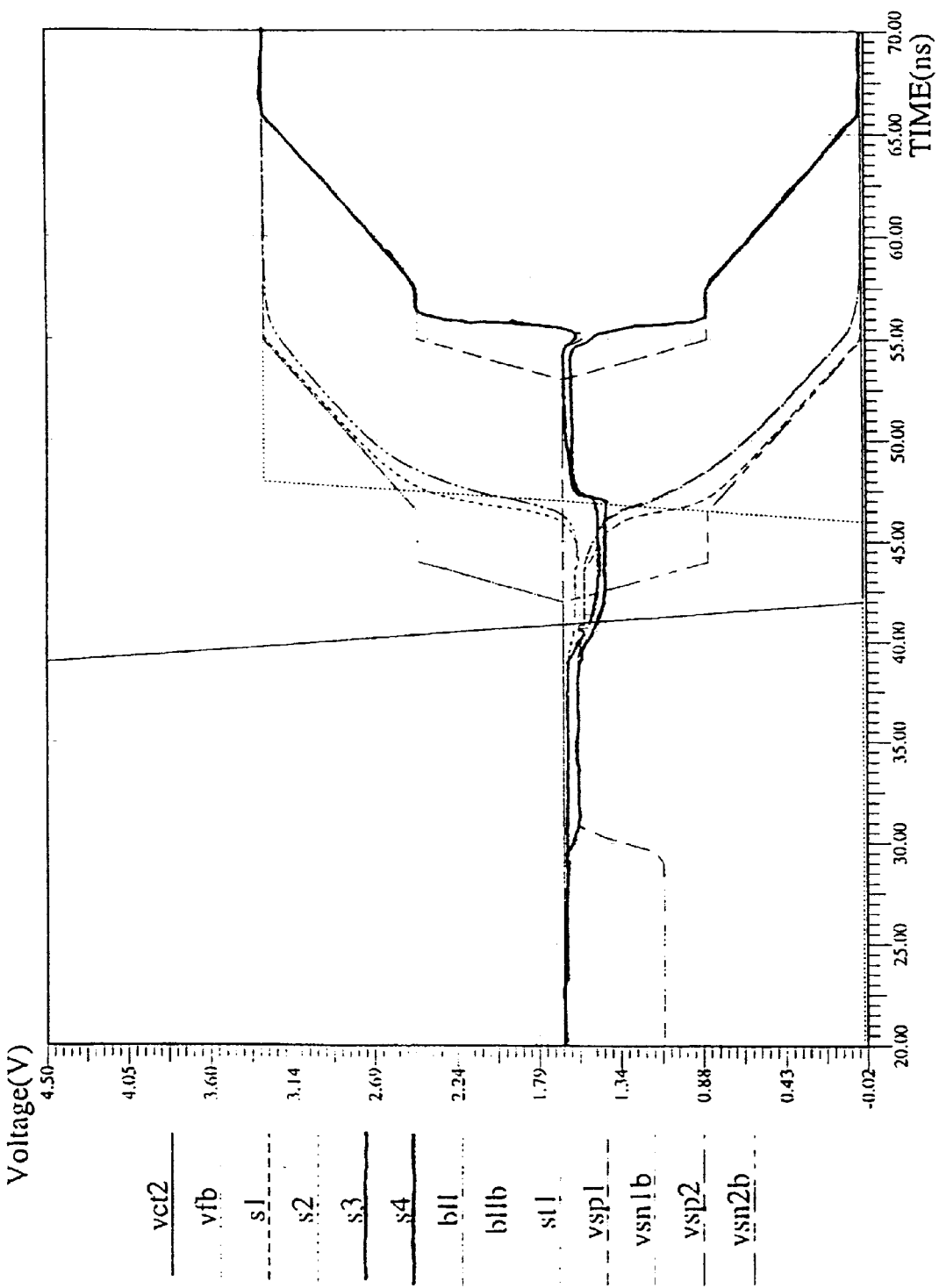
FIG. 17 illustrates the result of a second sensing simulation in the case where the data in FIG. 12 is a weak zero (0,1)
Figure 18:
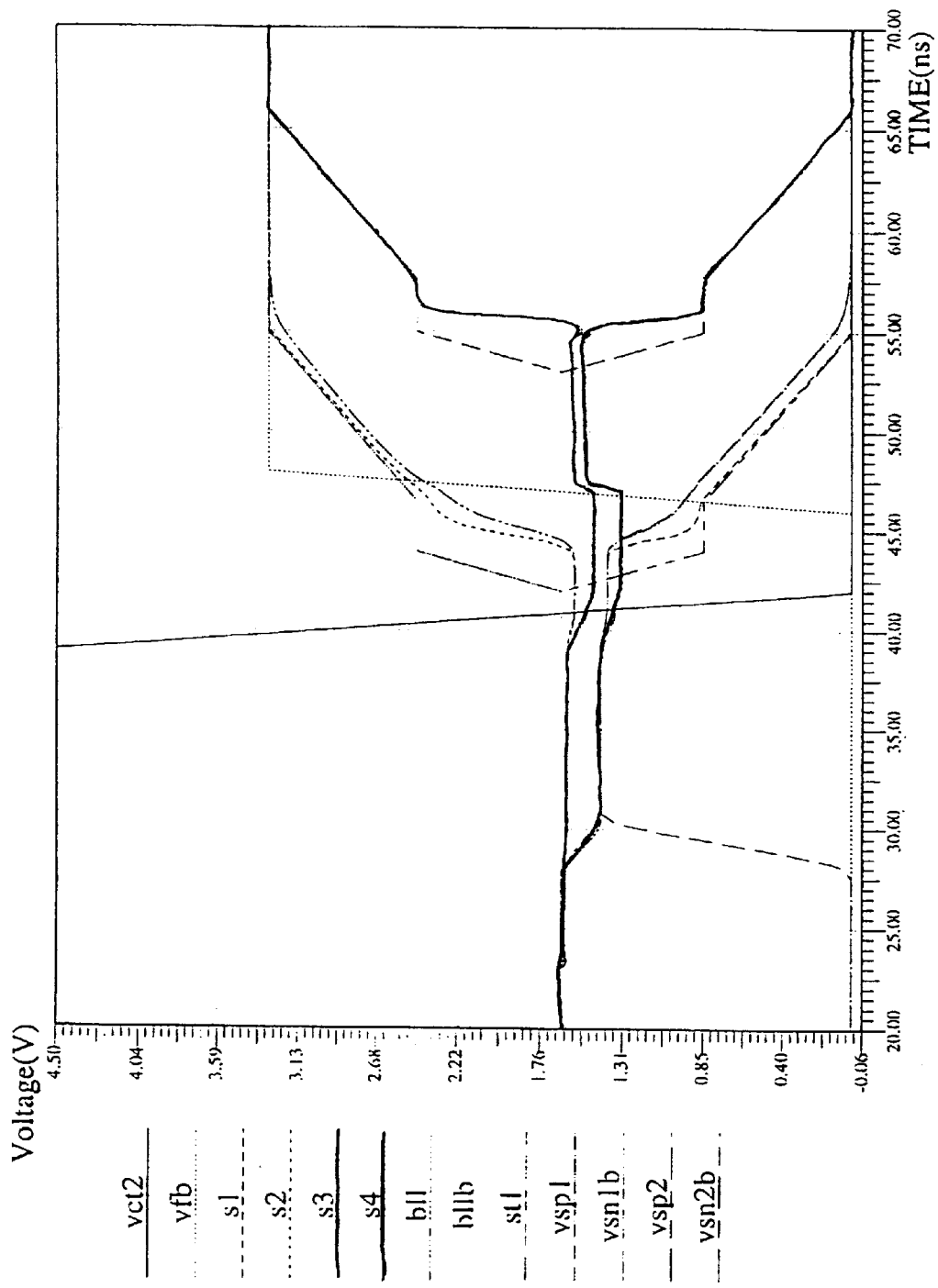
FIG. 18 illustrates the result of a second sensing simulation in the case where the data in FIG. 12 is a strong zero (0,0)

Here, the signal VaftSA which is enabled after the first sensing maintains NMOS transistors N34 and N35 in a turned-off status at the normal times as shown in FIGS. 13J and 14M.

In this manner, the optimization of the operation timing of the feedback signal for the sensing input nodes S3 and S4 becomes easier.

That is, when the right bit line BLR and the right bit line bar BLRB are spread from each other to the maximum, the operation efficiency of the feedback voltage VFB becomes maximal.

Thus the operation of the feedback voltage VFB is optimized, so that the data "11", "10", "01" and "00" can be normally operated.

Further, in this manner, the equalization problem arising between the node X4 and the sensing input nodes S3 and S4 is eliminated.

Further, the imbalance of the second sensing input margin, which is caused by the sustained coupling between the sensing input nodes S3 and S4, the right bit line BLR and the right bit line bar BLRB due to NMOS transistors N22 and N23, is eliminated.

Third, in the restore period as shown in FIG. 13H, VMT0 remains as VCC+, and VMT1 is grounded to VSS. Thus a left bit line bar BLLB is isolated, and then, a restore voltage VRST is added to VCC+ as shown in FIG. 13I. Thus in accordance with the potential of the node X4, if the node X4 is high, an NMOS transistor N21 is turned on, to put a node X1 to VCC+. Thus the charge of the left bit line BLL, the charge of the right bit line BLR and the charge of the right bit line bar BLRB are shared through the NMOS transistor N21. Thus particular voltages (⅔ VCC, ⅓ VCC) are formed to restore them into the left and right memory cells 20 and 40.

The time of turning-on the NMOS transistors N34 and N35 by the signals VaftSA which are enabled after the first sensing is after the second sensing as shown in FIGS. 13J and 14M.

On the other hand, the time of turning-off them is immediately before the activation of the restore voltage with VCC+ as shown in FIGS. 13I and 14I.

Therefore, when the second sensing begins, the failure factors of the sensing input nodes S3 and S4 have been completely eliminated.

Now descriptions will be made as to the case where the cell data is "1,0", that is, the case where ⅔ VCC stored in the cell is read out (ultimately S1=VCC, S2=VSS, S3=VSS and S4=VCC will be loaded at the normal operation). As shown in FIG. 14A, the equalize signal EQU is shifted to low so as to be disabled, and is turned off after precharging the bit line BL and the bit line bar BLB.

Here, it is considered that the node X4 is precharged with HVCC, and the word line WL1 is turned on as shown in FIG. 14B. Thus the data of the left/right memory cells 20 and 40 which have been having ⅔ VCC is loaded on the bit line BL in the form of charge sharing. The same data is also loaded on the sensing input node S3 of the second sense amplifier 70.

Under this condition, the data which is loaded on the bit line BL and the sensing input node S3 is "HVCC+ΔV", and VCT2 is low as shown in FIG. 14D. Thus the sensing input nodes S3 and S4 of the second sense amplifier 70 are isolated from the bit line BL and the bit line bar BLB, and then, the first sense amplifier 10 is activated by VSP1 and VSN1B as shown in FIG. 13E, thereby reading out high data (S1=VCC, S2=VSS) through a first sensing.

Under this condition, in the delta V10, the sensing input margin is justly reduced compared with when VCC is stored in the left/right memory cells 20 and 40.

Further, the operation is carried out after the sensing input nodes S3 and S4 have been fully shifted to VCC or to VSS, and therefore, the node X4 can perform an accurate operation. Further, there is prevented the phenomenon that the potential of the node X4 is dissipated to the sensing input node S3 during the restore, thereby making it possible to carry out a sufficient restore operation.

The sustained coupling of the NMOS transistors N22 and N23, which causes failures, is overcome in the following manner. That is, the NMOS transistors N34 and N35 of the isolating transistor 80 are in a turned-off status, and therefore, they are isolated from the sensing input nodes S3 and S4 which are the second sensing input terminals. Therefore, they are not at all influenced, thereby making it possible to carry out the second sensing in a perfect manner.

Figure 19:
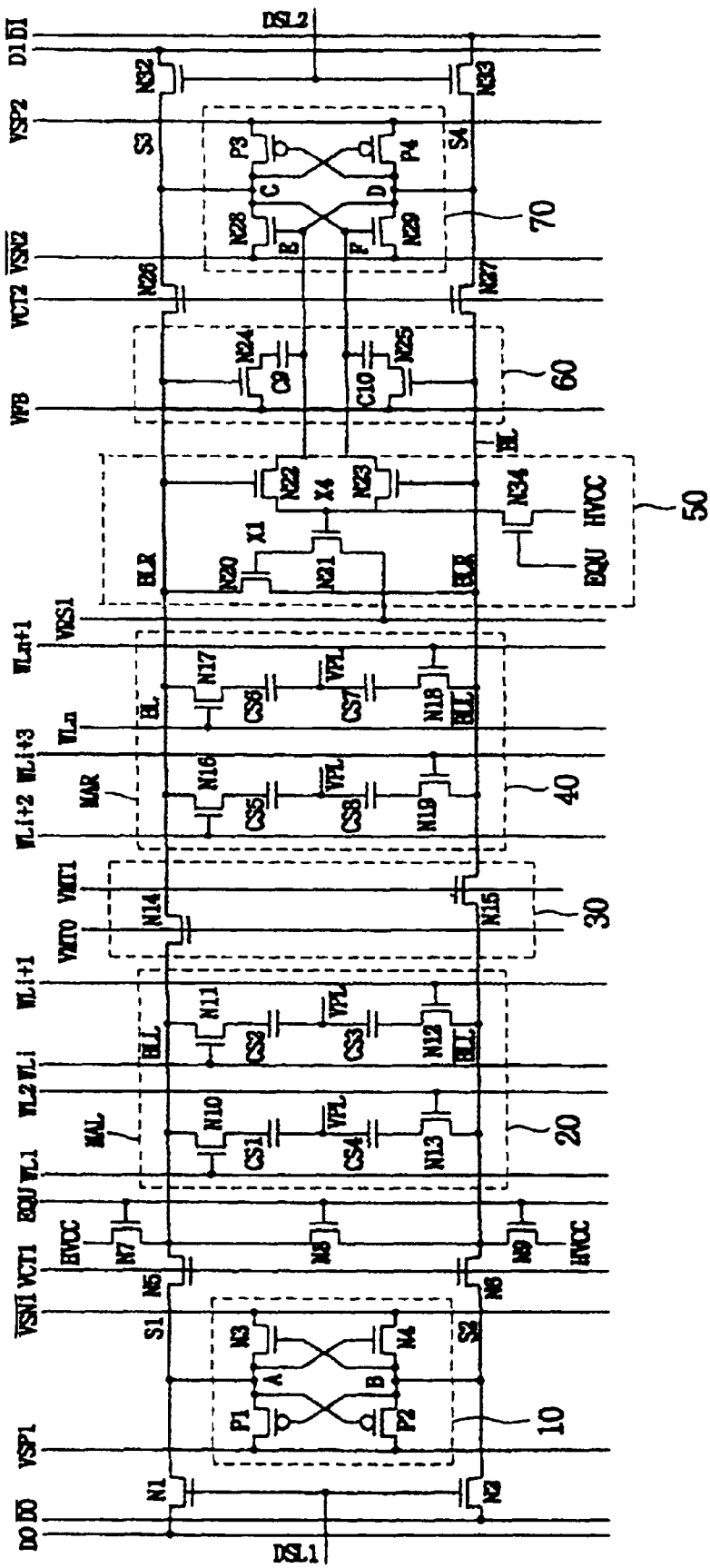
FIG. 19 is a circuit diagram showing the constitution of a second embodiment of the multilevel sensing circuit according to the present invention.

FIG. 19 is a circuit diagram showing the constitution of a second embodiment of the multilevel sensing circuit according to the present invention. As shown in this drawing, the multilevel sensing circuit according to the present invention includes: first and second sense amplifiers 10 and 70 per bit line of a general DRAM and per left and right memory cells 20 and 40; a feedback element 60 per bit line; a switching transistor 30 for branching a basic bit line; and a comparator 50 formed on the bit line, and the multilevel sensing circuit further includes an NMOS transistor N34 connected to a node X4 of the comparator 50.

In the comparator 50, the source of the NMOS transistor N34 is connected to a half power source voltage HVCC, its drain is connected to the node X4, and its gate is connected to the equalize signal.

There is no variation of the timing of respective control signals, but they are driven in the conventional manner.

Figure 1:
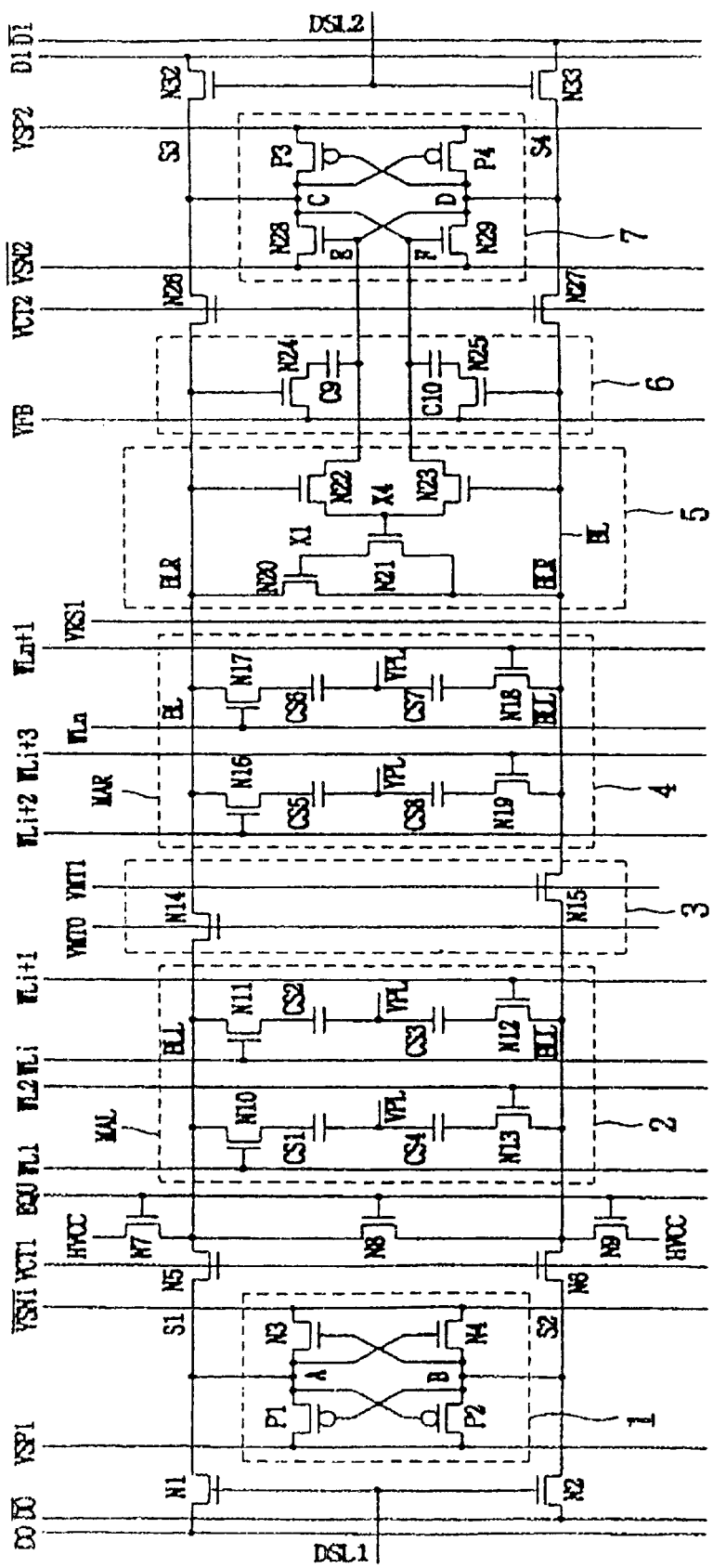
FIG. 1 is a circuit diagram showing the constitution of the general multilevel sense amplifier.
Figure 2:
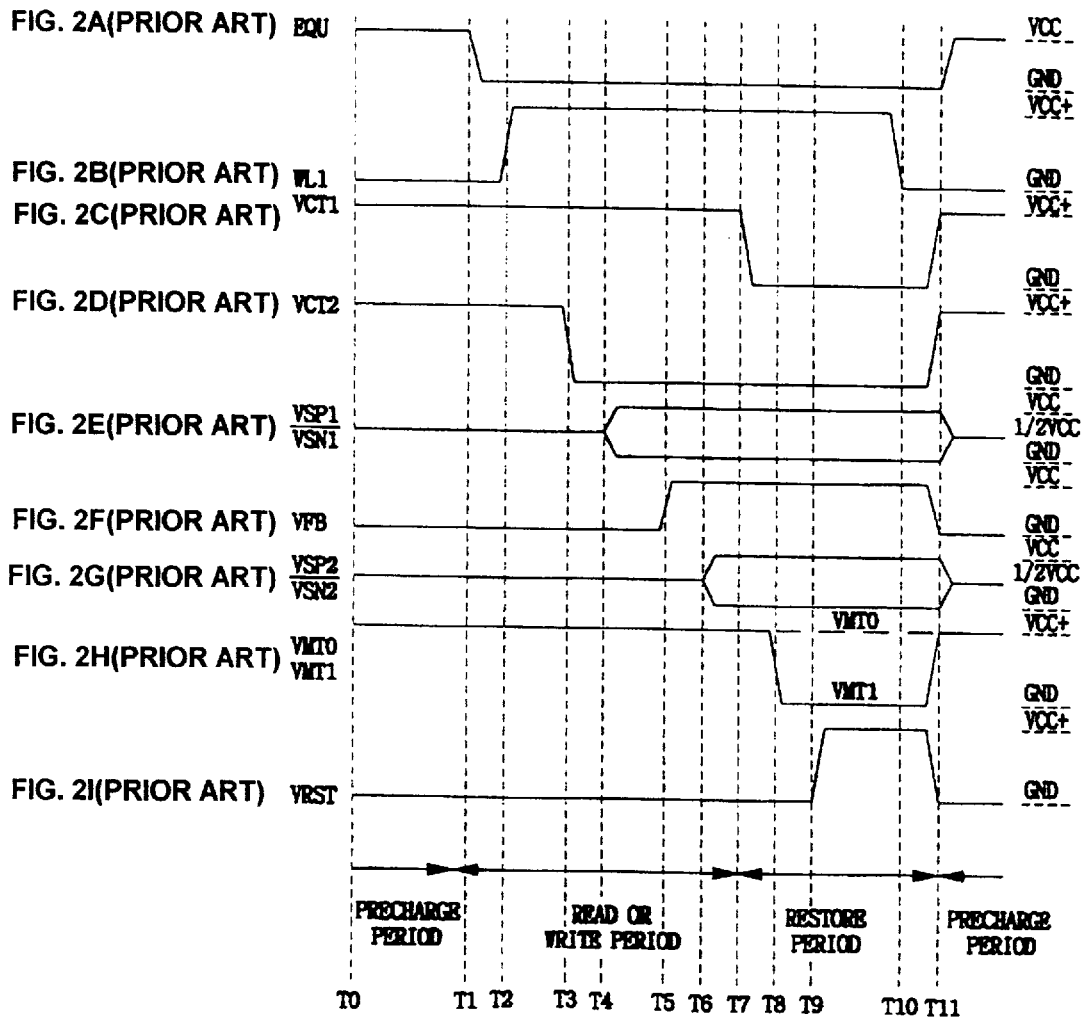
FIGS. 2A–2I is a timing chart for the read and restore in the amplifier of FIG. 1.
Figure 3:
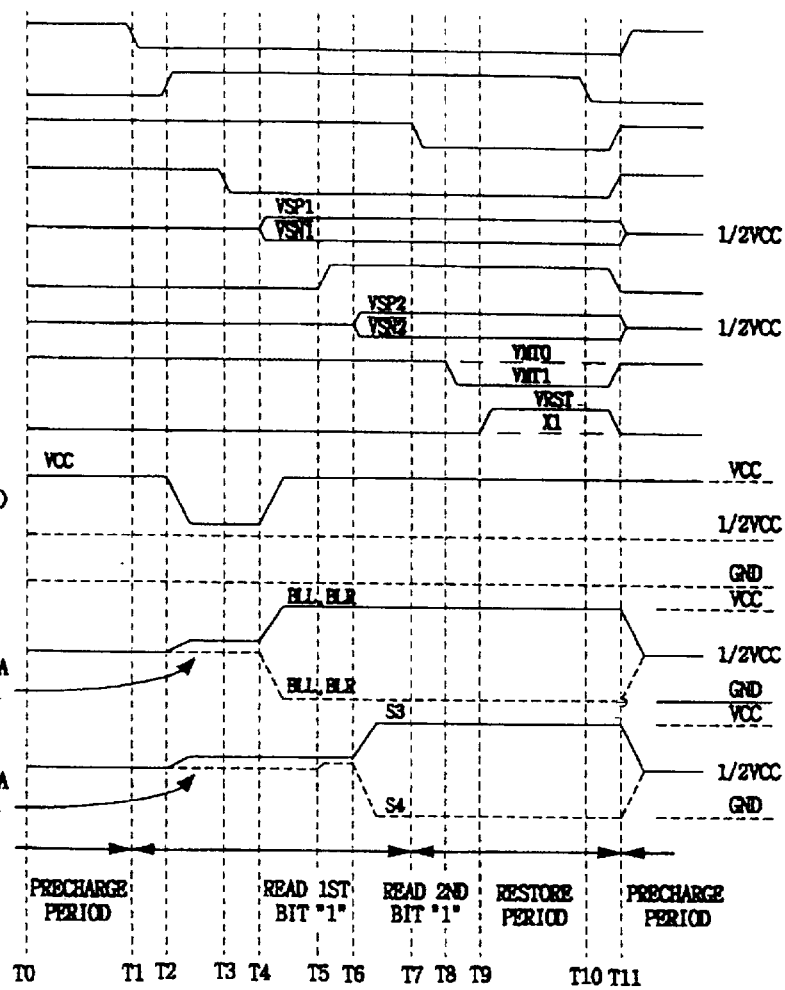
FIGS. 3A–3L is an internal timing chart for read and restore in the case where the data in FIG. 1 is a strong one (1,1)
Figure 4:
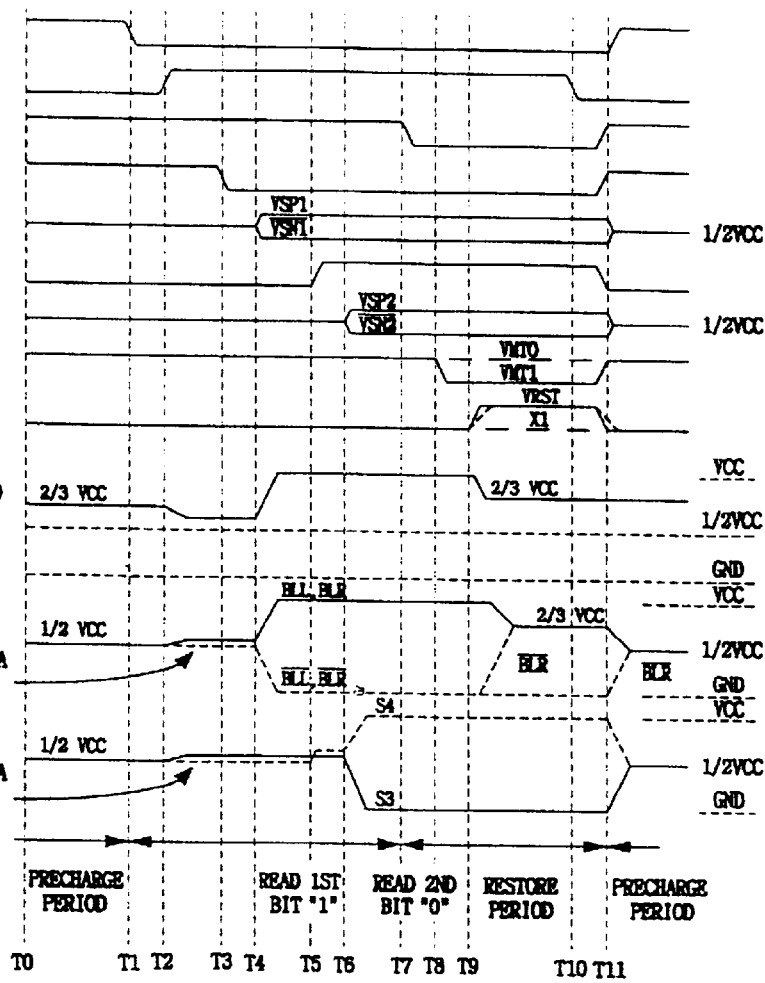
FIGS. 4A–4L is an internal timing chart for read and restore in the case where the data in FIG. 1 is a weak one (1,0)
Figure 5:
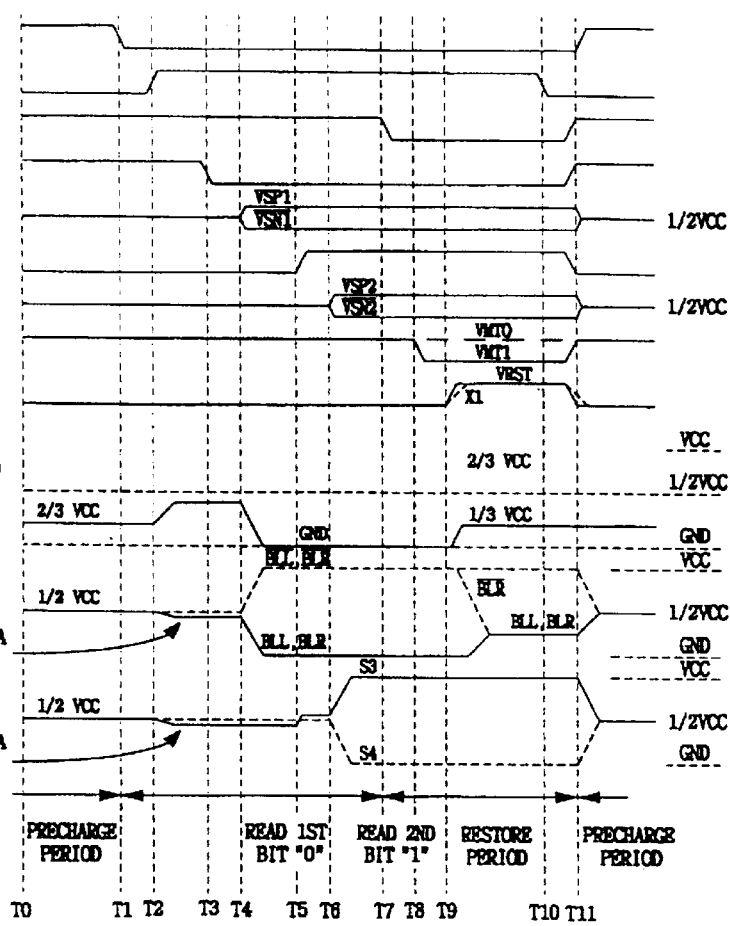
FIGS. 5A–5L is an internal timing chart for read and restore in the case where the data in FIG. 1 is a weak zero (0,1)
Figure 6:
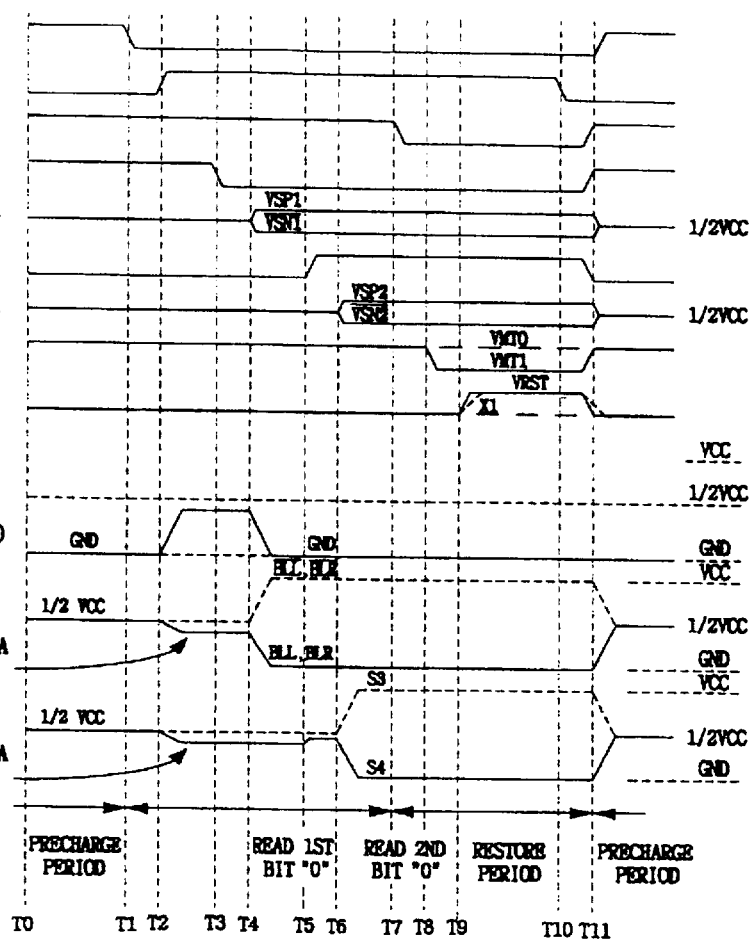
FIGS. 6A–6L is an internal timing chart for read and restore in the case where the data in FIG. 1 is a strong zero (0,0)
Figure 7:
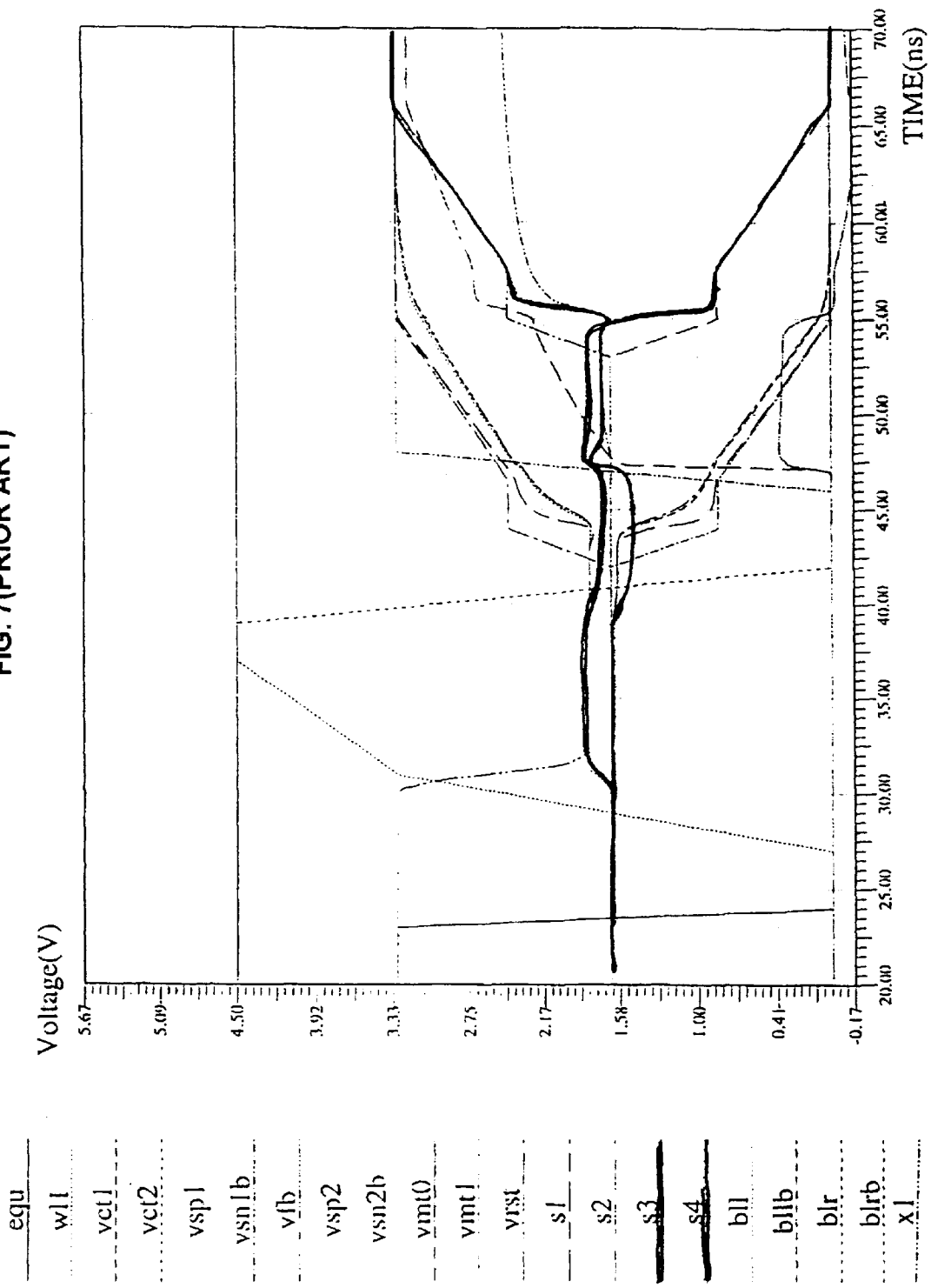
FIG. 7 illustrates the result of a second sensing simulation in the case where the data in FIG. 1 is a strong one (1,1)
Figure 8:
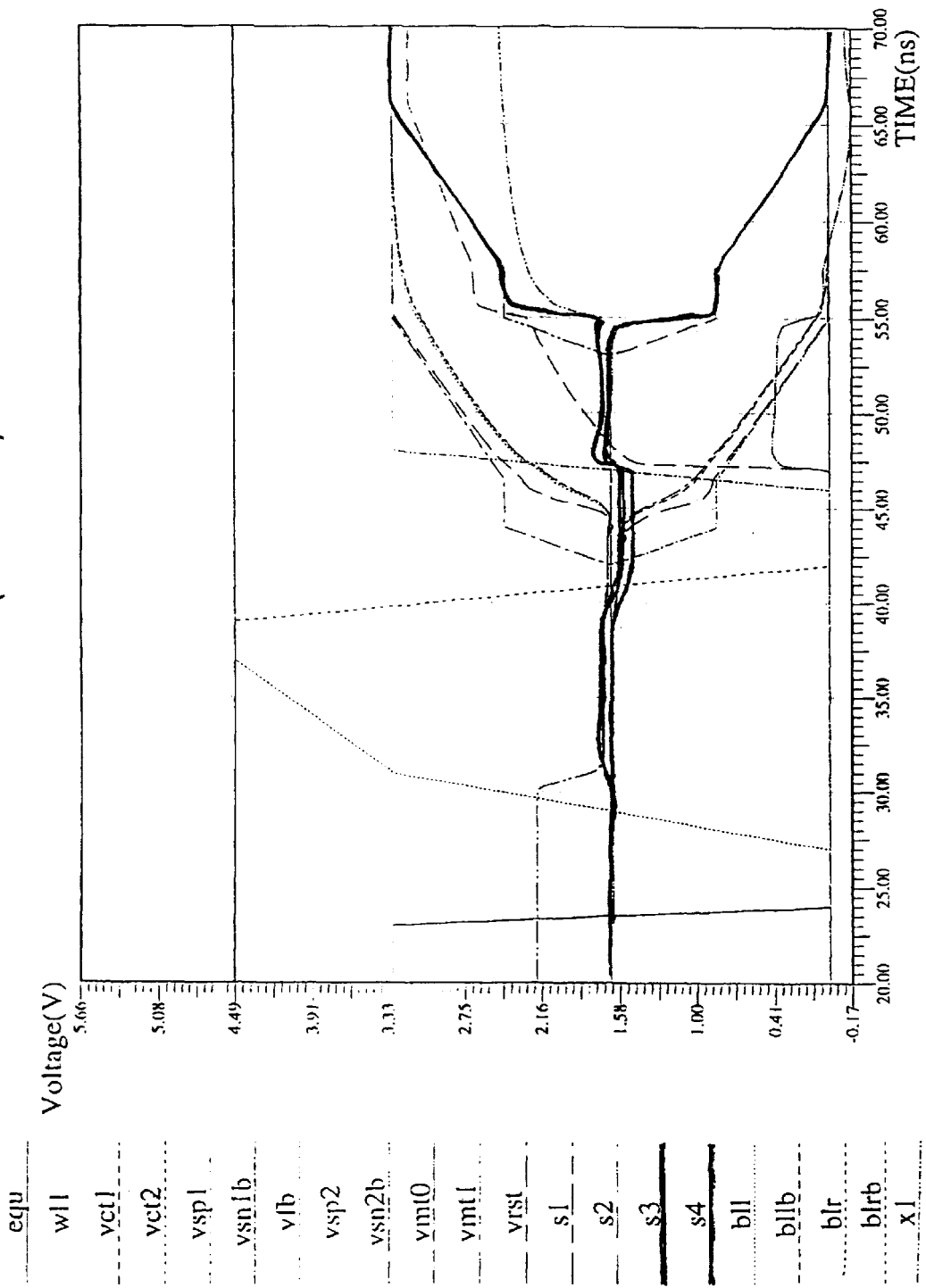
FIG. 8 illustrates the result of a second sensing simulation in the case where the data in FIG. 1 is a weak one (1,0)
Figure 9:
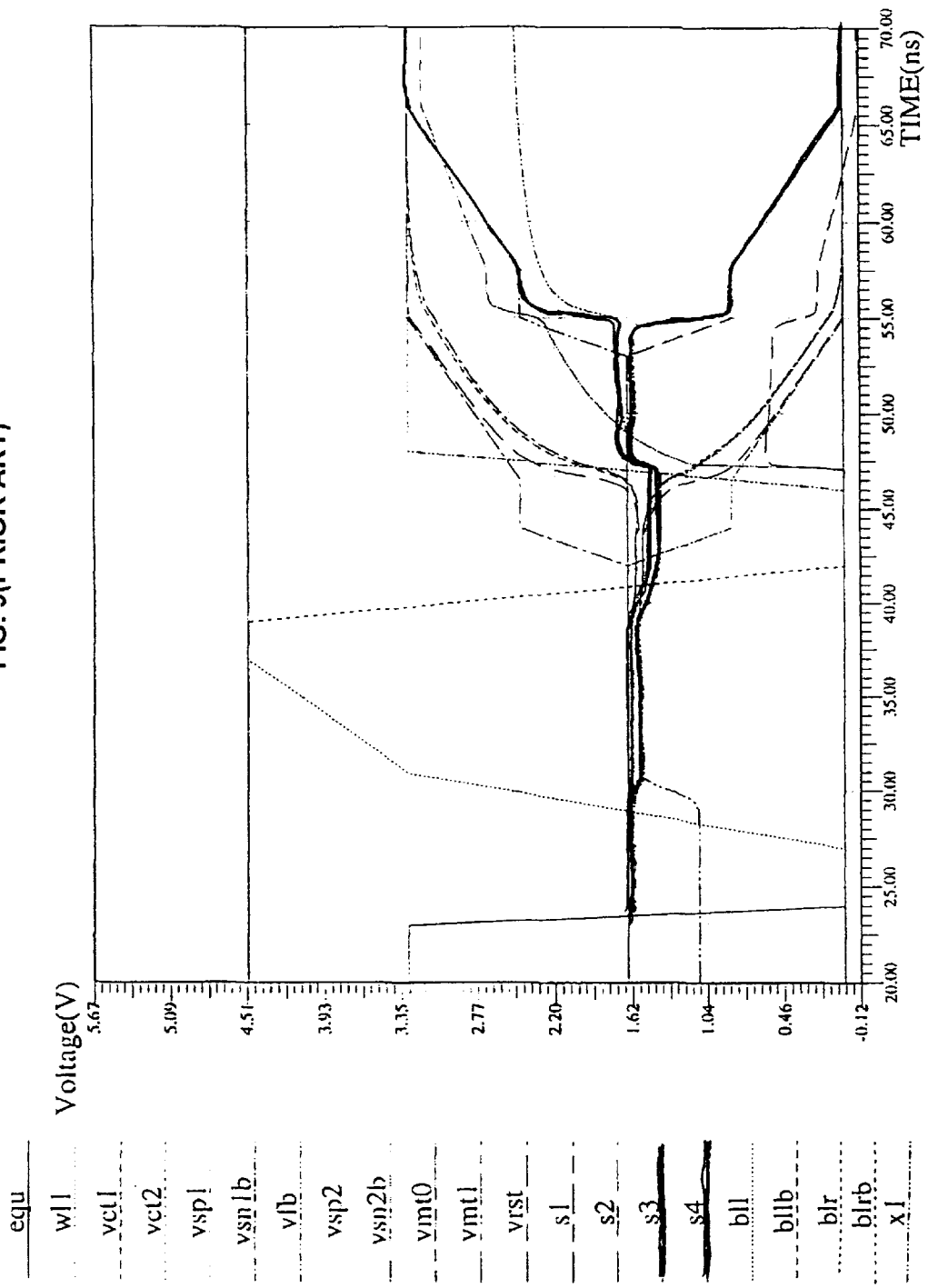
FIG. 9 illustrates the result of a second sensing simulation in the case where the data in FIG. 1 is a weak zero (0,1)
Figure 10:
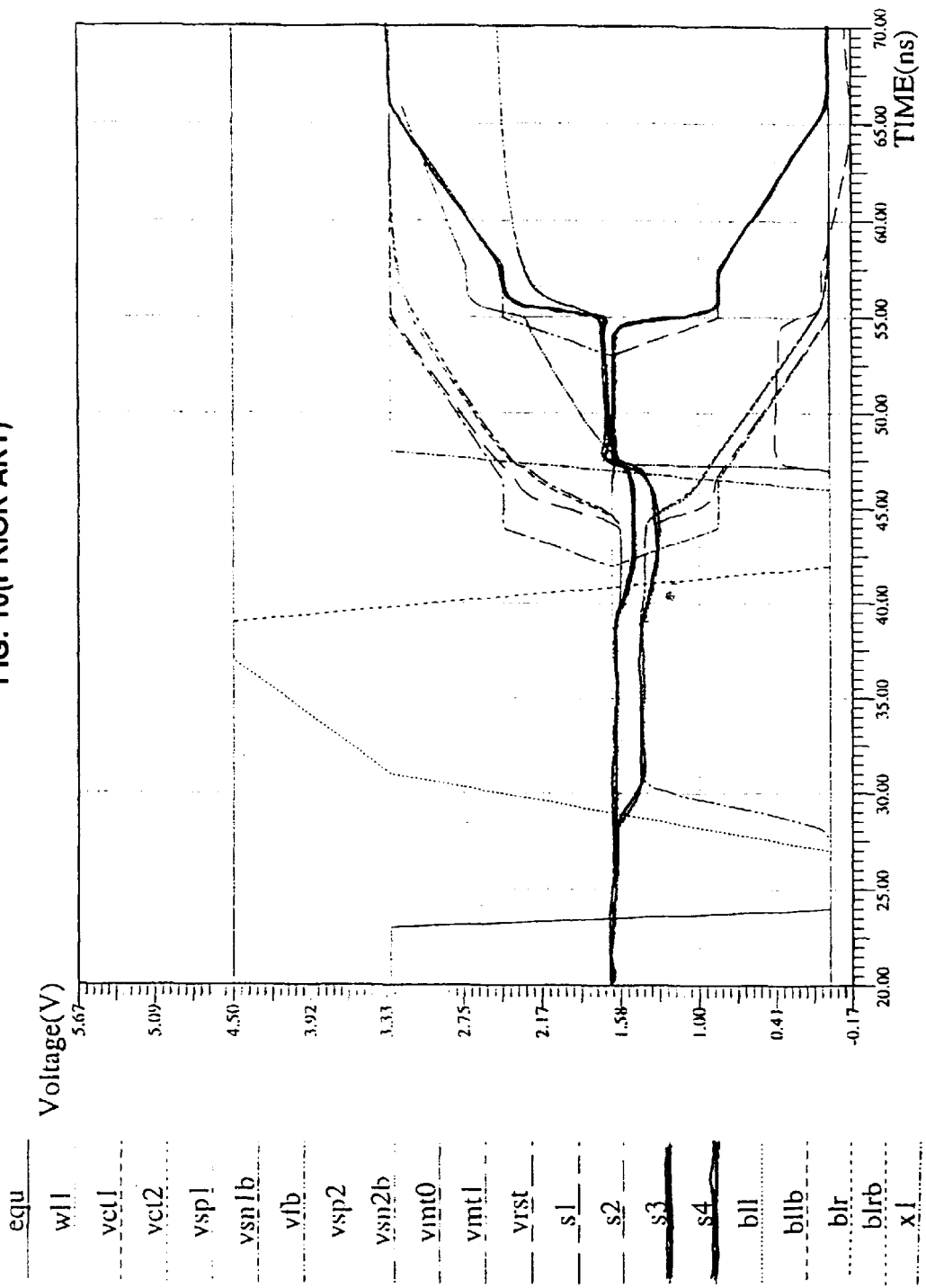
FIG. 10 illustrates the result of a second sensing simulation in the case where the data in FIG. 1 is a strong zero (0,0)
Figure 11:
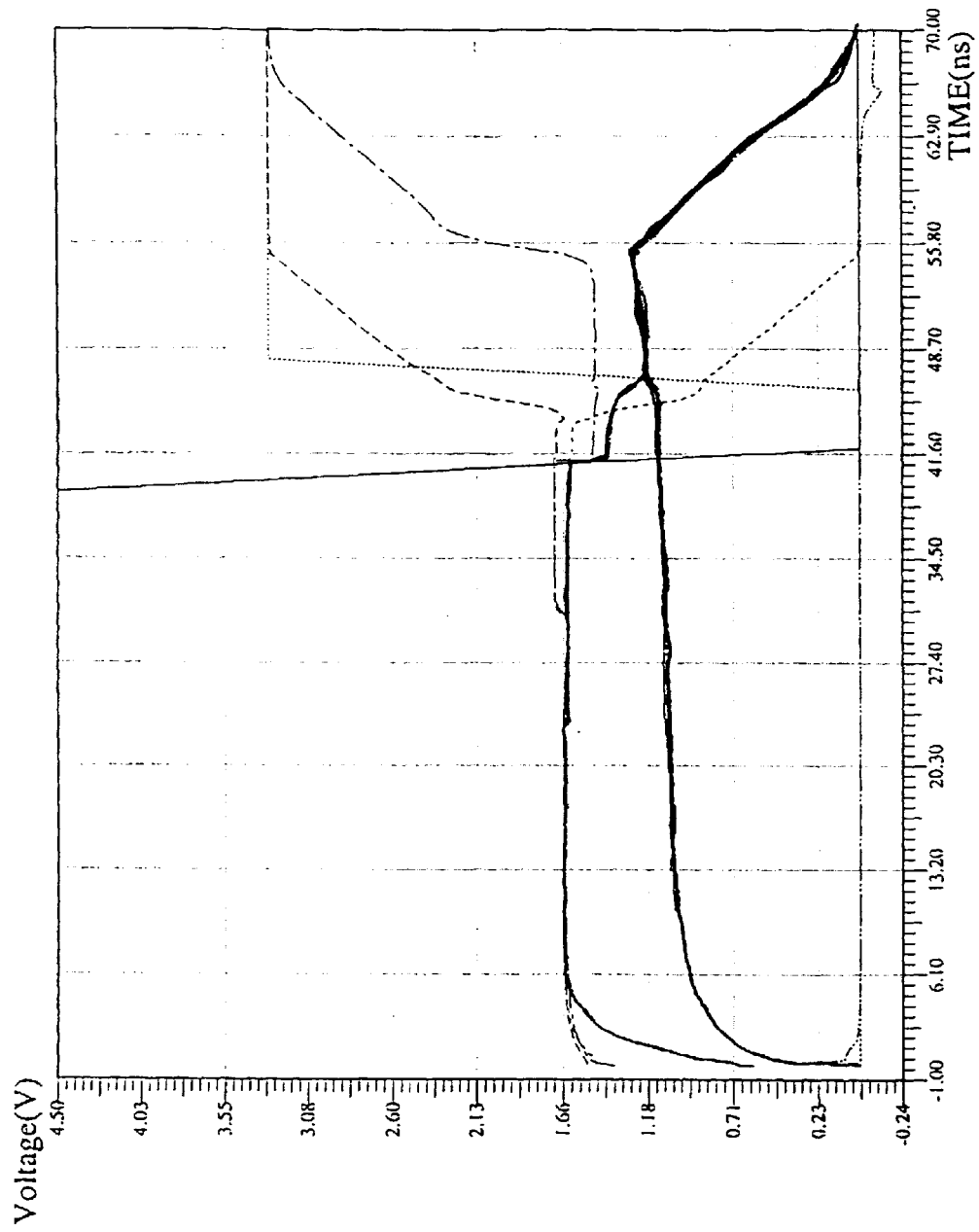
FIG. 11 illustrates the result of a second sensing simulation in the case of an imperfect conventional precharge level.

That is, as shown in FIG. 2A, in the precharge period, the equalize signal has a power source voltage VCC, and the NMOS transistors N7–N9 are all turned on. Therefore, the bit lines BLL and BLR and the bit line bars BLLB and BLRB are all precharged with a half power source voltage HVCC.

Under this condition, as shown in FIGS. 2C and 2D, VCT1 and VCT2 are all in a high voltage VCC+=VPP, and therefore, the sensing input nodes S3 and S4 of the second sense amplifier 70 can be made to have HVCC.

Figure 20:
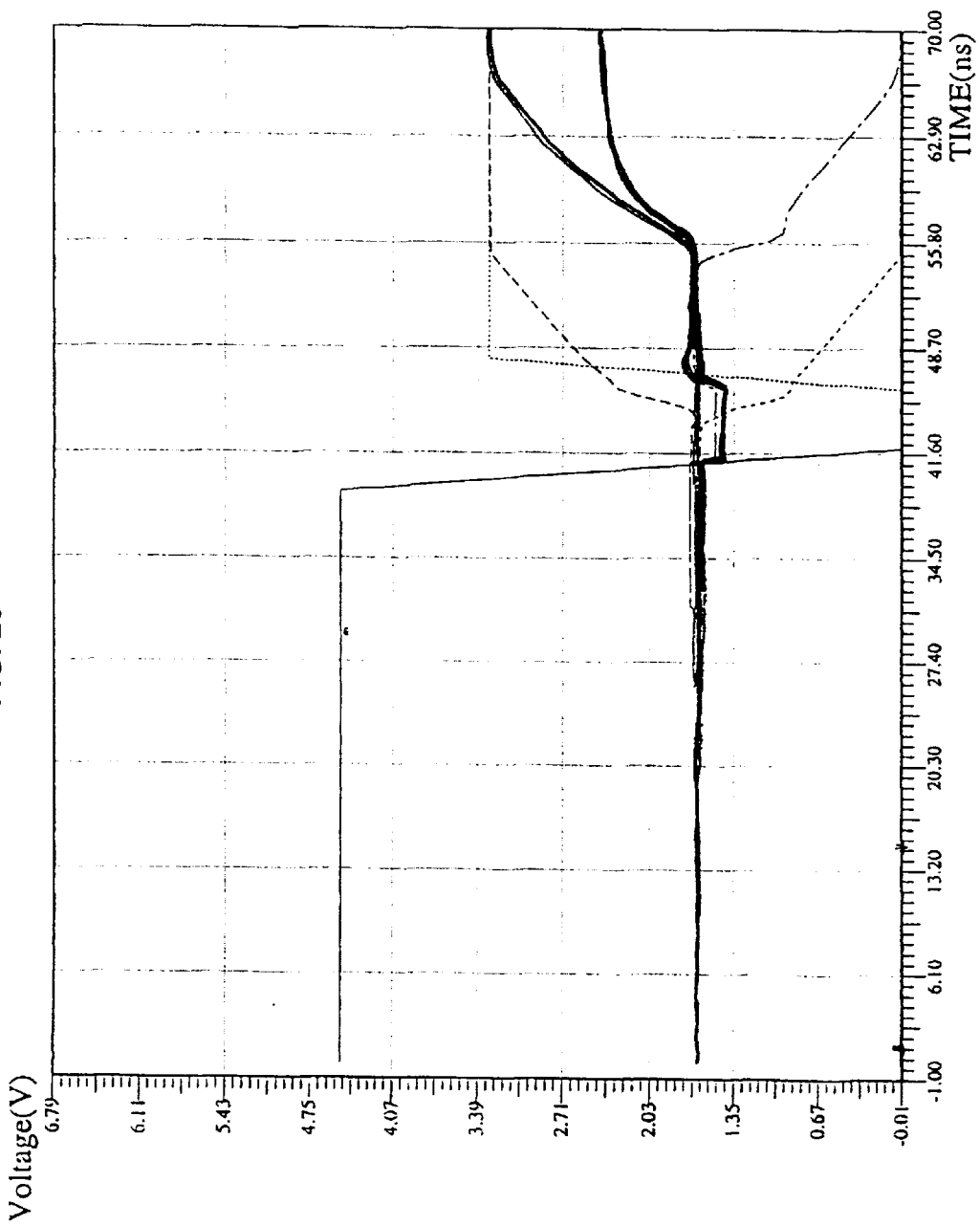
FIG. 20 illustrates the result of a second sensing simulation in the case of the perfect precharge level according to the present invention.

Here, when the first and second sense amplifiers 10 and 70 and the bit line BL are precharged, the equalize signal EQU is high, and therefore, the NMOS transistor N34 is turned on. Therefore, as shown in FIG. 20, the node X4 of the comparator 50 can be precharged with HVCC.

According to the present invention as described above, the second sensing input node is completely isolated in the multisensing circuit, and thus the deformation of the second sensing input can be made effective, while the gain can be improved.

Further, when the precharge is carried out in the multi-sensing circuit, a sufficient bit line plate voltage is furnished, and thus, the deformation of data during the second sensing can be prevented. As a result, the failure of the second sensing can be prevented, and a perfect sensing can be realized.

In the above, the present invention was described based on the specific embodiments, but it should be apparent to those ordinarily skilled in the art that various changes and modifications can be added without departing from the spirit and scope of the present invention which are defined in the appended claims.

What is claimed is:

1. A multilevel sensing circuit comprising first and second sense amplifiers per bit line of a general DRAM and per left and right memory cells; a feedback element per bit line; a switching transistor for branching a basic bit line; and a comparator formed on said bit line, the multilevel sensing circuit further comprising:

an isolating transistor connected between said comparator and sensing input nodes of said second sense amplifier, said isolating transistor being configured to selectively connect the comparator to the sensing input nodes in response to a signal.

2. The multilevel sensing circuit as claimed in claim 1, wherein said isolating transistor connects the comparator to the sensing input nodes after a second sensing is sufficiently carried out.

3. The multilevel sensing circuit as claimed in claim 1, wherein said isolating transistor disconnects the comparator from the sensing input nodes immediately before an operation of a restore voltage.

4. The multilevel sensing circuit as claimed in claim 1, wherein said isolating transistor comprises of NMOS transistors.

5. A multilevel sensing circuit comprising first and second sense amplifiers connected to each bit line to which left and right memory cells of a DRAM are connected, a feedback element connected to said each bit line, a switching transistor for selecting a bit line, and a comparator connected to said each bit line;

said multilevel sensing circuit further comprising an isolating transistor connected between said comparator and a sensing input node of said second sense amplifier, wherein said isolating transistor is turned on after a second sensing operation is carried out and turned off before a restore operation is carried out.

6. The multilevel sensing circuit according to claim 5, wherein said isolating transistor comprises at least one NMOS transistor.

7. The multilevel sensing circuit according to claim 6, wherein said NMOS transistor is controlled by an equalize signal.

8. A multilevel sensing circuit comprising first and second sense amplifiers per bit line of a general DRAM and per left and right memory cells; a feedback element per bit line; a switching transistor for branching a basic bit line; and a comparator formed on said bit line;

said multilevel sensing circuit further comprising an NMOS transistor having a drain connected to a node of the comparator, a source connected to a half power source voltage HVCC, and a gate controlled by an equalize signal.

9. A multilevel sensing method for storing and reading data to and from memory cells of a DRAM having a multilevel sensing circuit comprising first and second sense amplifiers connected to each bit line to which left and right memory cells of said DRAM are connected, a feedback element connected to said each bit line, a switching transistor for selecting a bit line, and a comparator connected to said each bit line, the method comprising:

providing an NMOS transistor connected to a node of said comparator; and precharging said node with a half power source voltage HVCC via said NMOS transistor.

10. The multilevel sensing method of claim 9, comprising a step of applying an equalize signal to control said NMOS transistor.

11. The multilevel sensing method as claimed in claim 9, comprising:

a step of applying an equalize signal to said node to thereby precharge the bit line with a half power source voltage.

* * * * *